United States Patent [19]

Chen et al.

[11] Patent Number: 5,418,019

[45] Date of Patent: May 23, 1995

[54] METHOD FOR LOW TEMPERATURE PLASMA ENHANCED CHEMICAL VAPOR DEPOSITION (PECVD) OF AN OXIDE AND NITRIDE ANTIREFLECTION COATING ON SILICON

[75] Inventors: Zhizhang Chen, Duluth; Ajeet Rohatgi, Marietta, both of Ga.

[73] Assignee: Georgia Tech Research Corporation, Atlanta, Ga.

[21] Appl. No.: 248,473

[22] Filed: May 25, 1994

[51] Int. Cl.⁶ .................... B05D 3/06; G02B 5/26
[52] U.S. Cl. .................... 427/579; 427/557; 427/578; 427/255.7; 359/586; 359/580
[58] Field of Search ........... 427/578, 579, 557, 255.7, 427/167, 166, 99; 136/252; 359/580, 586; 437/4

[56] References Cited

U.S. PATENT DOCUMENTS 4,649,088  3/1987  Mitsui et al. .................... 428/697
5,245,468  9/1993  Demiryont et al. .............. 359/359

FOREIGN PATENT DOCUMENTS 3-136237  6/1991  Japan .
3-248574  11/1991  Japan .

OTHER PUBLICATIONS

Shibata, "Plasma–Chemical Vapor–Deposited Silicon Oxide/Silicon Oxynitride Double–Layer Antireflective Coating for Solar Cells", Jpn. J. Appl. Phys. vol. 30, No. 5, May 1991, pp. 997–1001.
Michiels, P. P. et al., "Hydrogen Passivation of Polycrystalline Silicon Solar Cells by Plasma Deposition of Silicon Nitride," Proc. 21st IEEE Photovotaic Specialist Conf., 1990, pp. 638–643.
Lemiti, M. et al., "Hydrogenation of Multicrystalline Silicon from a Backside Silicon Nitride Layer," Proc. 22nd IEEE Photovotaic Specialists Conf., 1991, pp. 1002–1005.
Muller J. C. et al., "Improvement of Silicon Nitride Solar Cells after Thermal Processing Gettering or Passivation?" Proc. 22nd IEEE Photovotaic Specialists Conf., 1991, pp. 883–886.
Wenham, S. R. et al., "Efficiency Improvement in Screen Printed Polycrystalline Silicon Solar Cells by Plasma Treatments," Proc. 18th IEEE Photovotaic Specialists Conf., 1985, pp. 1008–1013.
Kishore, R. et al., "Growth of Silicon Nitride Films on Single Crystalline and Multicrystalline Silicon Solar Cells Using PECVD Technique," Proc. 6th IEEE Photovotaic and Engineering Conf. (New Dehli India), 1992, pp. 249–253.
Narayanan S. et al., "Silicon Nitride AR Coatings for Low Cost Silicon Solar Cells," Proc. 6th Int. Photovotaic and Engineering Conf. (New Delhi, India), 1992, pp. 133–136.
Green, M. A. et al., "High-Efficiency Silicon Solar Cells," IEEE Transactions on Electron Devices, vol. ED-31, No. 5, May 1984, pp. 679–683.

*Primary Examiner*—Roy V. King
*Attorney, Agent, or Firm*—Hopkins & Thomas

[57] ABSTRACT

A sequential plasma-enhanced chemical vapor deposition (PECVD) of SiN and $SiO_x$ produces a very effective double-layer antireflection coating. This antireflection coating is compared with the frequently used and highly efficient double-layer $MgF_2/ZnS$ coating. It is shown that the double-layer $SiO_x/SiN$ coating improves the short-circuited current ($J_{sc}$) by 47%, open-circuit voltage ($V_{oc}$) by 3.7%, and efficiency (Eff) by 55% for silicon cells with oxide surface passivation. The counterpart $MgF_2/ZnS$ coating gives smaller improvement in $V_{oc}$ and Eff. However, if silicon cells do not have the oxide passivation, the PECVD $SiO_x/SiN$ gives much greater improvement in the cell parameters, 57% in $J_{sc}$, 8% in $V_{oc}$, and 66% in efficiency, compared to the $MgF_2/ZnS$ coating which improves $J_{sc}$ by 50%, $V_{oc}$ by 2%, and cell efficiency by 54%. This significant additional improvement results from the PECVD deposition-induced surface/defect passivation. The internal quantum efficiency (IQE) measurements showed that the PECVD $SiO_x/SiN$ coating absorbs fair amount of photons in the short-wavelength range (<500 nm), however, the improved surface/defect passivation more than compensates for the loss in $J_{sc}$ and gives higher improvement in the cell efficiency compared to the $MgF_2/ZnS$ coating.

27 Claims, 3 Drawing Sheets

Fig. 1

(PRIOR ART)

METHOD FOR LOW TEMPERATURE PLASMA ENHANCED CHEMICAL VAPOR DEPOSITION (PECVD) OF AN OXIDE AND NITRIDE ANTIREFLECTION COATING ON SILICON

FIELD OF THE INVENTION

The present invention generally relates to integrated fabrication technology, and more particularly, to a method for forming a highly effective antireflection coating for a surface of silicon at low temperature using plasma enhanced chemical vapor deposition (PECVD).

BACKGROUND OF THE INVENTION

Recent studies in the industry have shown that the application of a silicon nitride (SIN) thin coating using low temperature PECVD can be very helpful in improving the efficiency of polysilicon (poly-Si) solar cells by reducing reflection from the cells. See, as examples, C. C. Johnson et al., "Plasma-enhanced CVD silicon nitride antireflection coatings for solar cells," *Solar Energy*, vol. 31, no. 4, pp. 355–358. 1983; P. P. Michiels et al., "Hydrogen passivation of polycrystalline silicon solar cells by plasma deposition of silicon nitride," in *Proc. 21st IEEE Photovoltaic Specialist Conf.*, 1990, pp. 638–643; and R. Kisshore et al., "Growth of silicon nitride films on single and multicrystalline silicon solar cells using PECVD technique," in *Proc. 6th Int. Photovotaic and Engineering Conf.*, (New Delhi, India), 1992, pp. 249–253. The SiN acts as an antireflection coating with a suitable refractive index n, but can also improve the performance of photovoltaic devices by defect/surface passivation. The reason for this feature is that a large amount of atomic hydrogen is produced during the PECVD process. In addition, PECVD is a low-temperature process (about 300° C.), compared to other CVD processes (for instance, LPCVD or APCVD), and has high throughput, good uniformity, better thickness control (>5%), and excellent reproducibility, compared to the physical evaporation techniques. All these advantages make PECVD SiN coating very attractive for solar cells.

The improvements in the minority-carrier diffusion length and quantum efficiency due to a single-layer SiN coating formed by PECVD on poly-Si solar cells have been investigated in the art. See P. P. Michiels et al., "Hydrogen passivation of polycrystalline silicon solar cells by plasma deposition of silicon nitride," in *Proc. 21st IEEE Photovoltaic Specialist Conf.*, 1990, pp. 638–643; M. Lemiti et al., "Hydrogenation of multicrystalline silicon from a backside silicon nitride layer," in *Proc. 22nd IEEE Photovotaic Specialists Conf.*, 1991, pp. 1002–1005; J. C. Muller et al., "Improvement of silicon nitride solar cells after thermal processing gettering or passivation?" in *Proc. 22nd IEEE Photovotaic Specialists Conf.*, 1991, pp. 883–886. The beneficial effects of a single-layer PECVD SiN on poly-Si solar cells relative to short-circuit current, open-circuit voltage, and cell efficiency have also been investigated in the industry. In this regard, see S. R. Wenham et al., "Efficiency improvement in screen printed polycrystalline silicon solar cells by plasma treatments," in *Proc. 18th IEEE Photovotaic Specialists Conf.*, 1985, pp. 1008–1013; R. Kisshore et al., "Growth of silicon nitride films on single and multicrystalline silicon solar cells using PECVD technique," in *Proc. 6th Int. Photovotaic and Engineering Conf.*, (New Delhi, India), pp. 249–253, 1992; and S. Narayanan et al., "Silicon nitride AR coating for low cost silicon solar cells," in *Proc. 6th Int. Photovoltaic and Engineering Conf.* (New Delhi, India), pp. 133–136, 1992.

A double-layer $MgF_2/ZnS$ antireflection coating is also known in the art and is often used in high-efficiency single-crystal silicon cells fabricated in the laboratory because the $MgF_2/ZnS$ coating has much better antireflection properties than that of a single-layer SiN coating. In this regard, see M. A. Green et al., "High efficiency silicon solar cells," *IEEE Trans. Electron Devices*, vol, ED-31, pp. 697–683, 1984. $MgF_2$ has a refractive index n of 1.35, and ZnS has an index n of 2.4. The refractive index n of stoichiometric silicon nitride ($Si_3N_4$) is around 2.0. Therefore, it is not as suitable as a double-layer antireflection coating as ZnS. On the other hand, SiN applied by PECVD is an amorphous form of $Si_xN_y:H_z$, in which x, y, and z strongly depend on the deposition conditions, especially on the gas flow ratio of $NH_3/SiH_4$ and substrate temperature. The refractive index n of SiN depends on the ratio of N/Si in the coating and can be controlled in the range of 1.96–3.5 by adjusting the ratio of $NH_3/SiH_4$. Thus, the PECVD process provides an opportunity for obtaining higher index SiN coating by making it silicon-rich. However, silicon-rich coatings generally show high absorption, and therefore absorption losses must be considered when high index SiN coatings are used.

Although use of either the single-layer SiN coating or the double-layer $MgF_2/ZnS$ coating as an antireflection mechanism has merit, the formation of these coatings has significant disadvantages. The single-layer SiN is not as effective in antireflection as the double-layer $MgF_2/ZnS$ coating, and suffers significant reflection loss. Moreover, the double-layer $MgF_2/ZnS$ coating is formed by thermal evaporation, which is extremely time consuming. The formation requires undesirably low vacuum conditions, generally around $10^{-6}$ torr. Hence, production of these coatings on a mass commercial scale is expensive.

SUMMARY OF THE INVENTION

An object of the present invention is to overcome the problems and inadequacies in regard to the prior art as noted above and as generally known in the industry.

Another object of the present invention is to provide a method for optimally minimizing reflection from a surface of silicon.

Another object of the present invention is to provide a method for forming a highly effective antireflection coating for a surface of silicon at low temperature.

Another object of the present invention is to provide a method for forming at desirable pressure and electromagnetic radiation levels, a highly effective antireflection coating for a surface of silicon.

Another object of the present invention is to provide a method for forming a highly effective antireflection coating for a surface of silicon using plasma enhanced chemical vapor deposition (PECVD).

Another object of the present invention is to provide a method for inexpensively forming a highly effective antireflection coating for a surface of silicon.

Briefly described, the present invention is a method comprising the following steps: forming a silicon nitride coating on silicon using a plasma enhanced chemical vapor deposition process; forming a silicon oxide coating on the silicon nitride coating using the PECVD process; and adjusting an amount of silicon in the silicon nitride coating so that the silicon nitride coating in combination with the silicon oxide coating inhibits reflections from the surface. In a sense, a refractive index associated with the silicon nitride coating is manipulated so that the silicon nitride coating in combination with the silicon oxide coating inhibits reflections from the surface. The novel double-layer coating of the present invention can be applied to any silicon surface requiring an antireflection coating and to any type of silicon, including amorphous, crystalline, and polycrystalline silicon and n-doped, p-doped, and intrinsic silicon.

In the preferred embodiment, the process sequence involves depositing 59 nm of a silicon nitride (SiN) coating via PECVD on a silicon surface directly, and then subsequently depositing 95 nm of a silicon oxide ($SiO_x$) coating via PECVD on top of the existing SiN coating. Silane ($SiH_4$), amonia ($NH_3$), and nitrogen ($N_2$) gases were used for SiN deposition, and the refractive index of SiN coating was controlled in the range of 2.2–2.3 by adjusting $SiH_4/NH_3$ ratio. The index of SiN used in this invention is different from conventional SiN coating which is in the range of 1.9–2.0. $SiH_4$ and nitrous oxide ($N_2O$) were used for $SiO_x$ deposition, and refractive index of $SiO_x$ is in the range of 1.45–1.5. The PECVD deposition is in the low temperature range of about 250°–300° C., and low electromagnetic (radio frequency; RF) power is used in the range of 20–40 W. The deposition pressure is held at about 0.9 torr, and thus, no high vacuum system is needed in this technique. Following the PECVD deposition, a 350° C. lamp anneal in forming gas is used for surface passivation and to improve the electrical contact between the device electrode and silicon surface.

The combination of the 59 nm SiN coating with refractive index n of 2.3 and 95 nm $SiO_x$ coating with refractive index of 1.45 results in an excellent antireflection coating for silicon photovoltaic devices. Experimental data showed that this double-layer coating also provides very effective defect passivation on silicon solar cells. Therefore, by using this invention, the surface defect passivation and antireflection coating can be accomplished in a single process step, instead of two process steps needed in conventional process. Compared to conventional thermal evaporation techniques, this invention is more cost-effective, has higher throughput, better uniformity, and thickness control. This invention also can be easily transferred to large scale production.

Other objects, features, and advantages of the present invention will become apparent to one with skill in the art upon examination of the following drawings and detailed description. It is intended that all such additional objects, features, and advantages be included herein within this disclosure and within the scope of the present invention.

BRIEF DESCRIPTION OF THE DRAWINGS

The present invention can be better understood with reference to the following drawings.

DETAILED DESCRIPTION OF THE PREFERRED EMBODIMENTS

Figure 1:
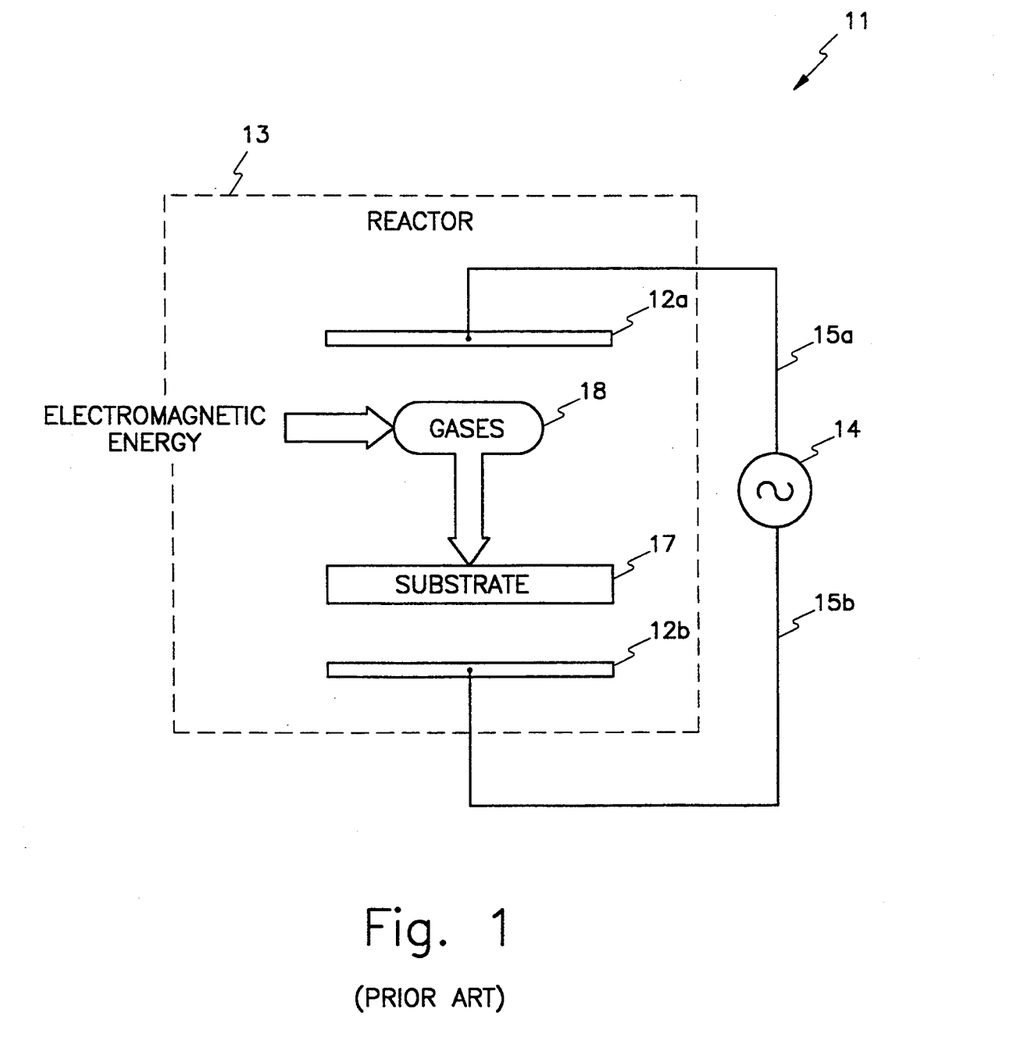
FIG. 1 is a schematic diagram of a conventional PECVD system.

The present invention is a novel double-layer antireflection coating which is applied to a silicon surface at low temperature using PECVD. The PECVD process and systems for performing the PECVD process are well known in the art. However, for the purpose of better understanding the present invention, a typical PECVD system 11 is illustrated in FIG. 1. As shown in FIG. 1, the PECVD system 11 has generally planar opposing electrode plates 12a, 12b situated within a reactor 13. In the preferred embodiment, the reactor 13 is a commercial Plasma-Therm 700 series reactor. The electrodes 12a, 12b are connected to and energized by an alternating current (AC) power source 14 via respective electrical lines 15a, 15b. Preferably, the power source 14 is a conventional 13.56 megahertz (MHz) RF power source. A substrate 17, preferably a silicon wafer in the present invention, is disposed between the electrodes 12a, 12b, and gases 18 are passed over the substrate 18, as shown. Electromagnetic energy (for instance, by RF waves) is imparted to the gases 18 to thereby inject energy into and excite the gases 18. Generally, the gases 18 tend to glow or arc as a result of the excitation, and the excited gases 18 are referred to as a plasma. The excitation by the electromagnetic energy causes a reaction(s) between the constituents of the gases 18 and, consequently, a coating is deposited on the substrate 17. PECVD is advantageous because deposition can occur at low temperatures.

The antireflection coating of the present invention is particularly applicable to solar cells fabricated from silicon, but could be employed in virtually any application where an antireflection coating is needed for a silicon surface. Moreover, the antireflection coating of the present invention can be applied to amorphous, crystalline, or polycrystalline silicon as well as n-doped, p-doped, or intrinsic silicon. A typical solar cell includes a junction of n-doped silicon and p-doped silicon. As energy strikes the cell, holes migrate toward the p-doped side, while electrons migrate toward the n-doped side, thereby generating a potential difference and a source of current. In the preferred embodiment, the novel antireflection coating is applied to the external n-doped and/or p-doped surfaces of a solar cell to optimally minimize reflections from these surfaces.

An SiN coating and then an $SiO_x$ coating were formed on a silicon substrate 17. These coatings were prepared using PECVD in a reactor 13 operated with the power source 14 generating an AC signal at 13.6 MHz. In the preferred embodiment, the reactor 13 is a series 700 reactor manufactured and made commercially available by Plasma-Therm, Inc., U.S.A. $SiH_4$, $NH_3$, $N_2$ gases were used for SiN deposition, and $SiH_4$, $N_2$ gases were involved in the subsequent $SiO_x$ deposition. The reactor pressure of reactor 13 was held at about 0.9 torr for both depositions. Substrate temperature was about 300° C., and the RF power produced by the source 14 was about 30 W and about 20 W for the SiN deposition and the SiO$_x$ deposition, respectively. These conditions resulted in a growth rate of about 100 A/min for SiN, and 300 A/min for SiO$_x$. Baseline n+—p—p+ solar cells were fabricated by conventional phosphorus diffusion on the front and A1 treatment on the back of p-type (0.2 Ω·cm) float zone (100) substrates.

The refractive index n and thickness of the deposited coatings were measured by using a conventional ellipsometer. The solar cells were characterized by a combination of light and dark I-V, reflectivity, spectral response, and internal quantum efficiency measurements before and after the antireflection coating to evaluate the change in the cell parameters. Several 1×1 cm cells were fabricated on 3-in-diameter wafers and were isolated by mesa etching. A few cells on each wafer were coated with MgF$_2$/ZnS, while others were coated with SiO$_x$/SiN for the controlled comparison of the two coatings. Thus, all the cells experienced the same fabrication sequence, except for the difference in the antireflection coating at the end.

After antireflection coatings were formed on the cells, the cells were subjected to 350° C./20 min anneal under tungsten halogen lamps in forming gas ambient. During the physical evaporation of MgF$_2$/ZnS and the PECVD deposition of SiO$_x$/SiN, selected areas on the wafers were covered by thin glass plates to simultaneously obtain antireflection coated glass plates. In order to assess the effect of photon absorption in the coatings, the internal quantum efficiency (IQE) of the same cell was measured three times, first with an uncoated glass plate on the top of the cell, and then with the glass plates coated with MgF$_2$/ZnS and SiO$_x$/SiN coatings, respectively. Since the reflectance effects are removed in the IQE measurement, any change in the IQE of the cell corresponds to the absorption in the coating.

Figure 2:
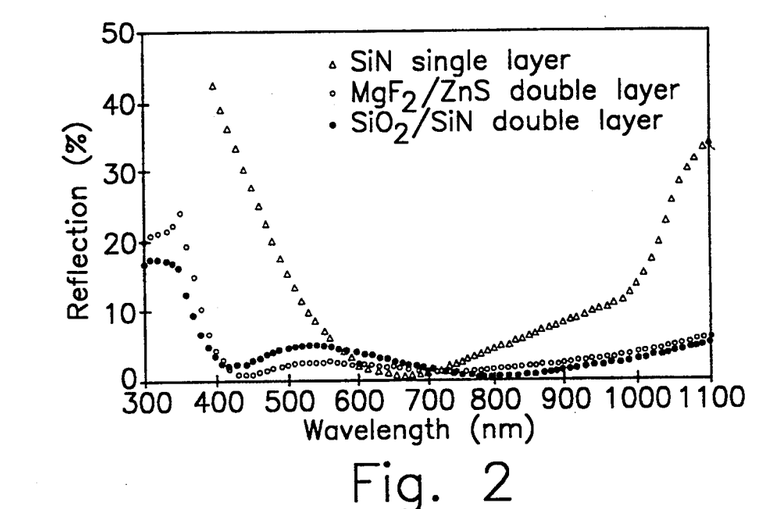
FIG. 2 is a graph of reflection versus wavelength for silicon cells having (a) a single-layer SiN coating, (b) a double-layer $MgF_2$/ZnS coating, and (c) a double-layer $SiO_x$/SiN coating.

The refractive index n of SiN formed by PECVD was adjusted by controlling the NH$_3$/SiH$_4$ gas flow ratio. The refractive index n was varied in the reactor 13 in the range of approximately 3.5 to 1.9. Since an index n of 2.4 is desirable, this flexibility allowed us to optimize the PECVD SiO$_x$/SiN double-layer antireflection coating. It was found that the use of higher index SiN in the SiO$_x$/SiN coating significantly reduced the reflection losses, as shown in FIG. 2, but it also resulted in higher absorption loss due to the silicon-rich SiN coating. Thus, a compromise has to be made between the reflection and absorption losses to optimize the index of antireflection coating.

Antireflection coating model calculations showed that 59 nm thick SiN with an index n of 2.3, in conjunction with 95 nm thick SiO$_x$ with an index n of 1.45, should give fairly low average reflectance over the entire solar spectrum. It was confirmed experimentally that a 59 nm thick SiN coating with refractive index n of about 2.3, underneath a 95 nm PECVD SiO$_x$ with an index n of 1.45, indeed gave the highest J$_{sc}$. Use of higher index (n>2.3) SiN coating resulted in lower reflectance in the short-wavelength range, but higher reflection in the long-wavelength rage, along with higher absorption loss. FIG. 2 shows a comparison of the reflectance data for a single-layer SiN coating (n=2.0, T=70 nm); a double-layer SiO$_x$/SiN (n=1.45, T=95 nm)/(n=2.3, T=59 nm); and a double-layer MgF$_2$/ZnS (n=1.38, T=110 nm)/n=2.3, T=55 nm). FIG. 2 further shows that both the double-layer coatings have excellent antireflection properties, with <5% reflection in the entire wavelength range of 400–1100 nanometers (nm). The SiO$_x$/SiN coating shows a slightly higher reflection than the MgF$_2$/ZnS coating in the range of 450 nm to 700 nm, partly because SiO$_x$ has higher refractive index (n=1.45) than MgF$_2$ (n=1.38). Unlike the PECVD SiN, the refractive index n of PECVD SiO$_x$ is difficult to change, especially below n=1.4.

Tables A and B set forth hereafter show a comparison of the effects of the two antireflection coatings on silicon cells, without the SiO$_x$ surface passivation. Several runs were made to check the reproducibility of these results. Table A shows the parameters for the prior art MgF$_2$/ZnS coating, and Table B shows the parameters for the novel SiO$_x$/SiN coating. These tables demonstrate that the novel SiO$_x$/SiN coating gives a remarkably large increase in the cell parameters, 57% in J$_{sc}$, 8% in V$_{oc}$, and 66% in efficiency (Eff) of the unpassivated cells. The counterpart MgF$_2$/ZnS gave only 50% improvement in J$_{sc}$, 2% in V$_{oc}$, and 54% in Eff.

TABLE A

| | MgF$_2$/ZnS Coating | | | | |
|---|---|---|---|---|---|
| ID | J$_{SC}$ (mA) | V$_{OC}$ (V) | FF | Eff (%) | J$_O$ (A) |
| Before | 22.71 | 0.600 | 0.78 | 10.63 | 6.4 × 10$^{-13}$ |
| After | 34.29 | 0.612 | 0.778 | 16.34 | 5.2 × 10$^{-13}$ |
| Improvement | 50% | 2% | | 54% | |

TABLE B

| | SiO$_x$/SiN Coating | | | | |
|---|---|---|---|---|---|
| ID | J$_{SC}$ (mA) | V$_{OC}$ (V) | FF | Eff (%) | J$_O$ (A) |
| Before | 22.42 | 0.602 | 0.781 | 10.53 | 6.0 × 10$^{-13}$ |
| After | 35.47 | 0.650 | 0.76 | 17.52 | 1.7 × 10$^{-13}$ |
| Improvement | 57% | 7.9% | | 66% | |

The maximum improvement in J$_{sc}$ (ΔJ$_{sc}$/J$_{sc}$) due to an antireflection coating, assuming IQE does not change, can be estimated by the following equation:

$$\frac{\Delta J_{sc}}{J_{sc}} = \frac{R - R^1}{1 - R}$$

where R and R$^1$ are the average reflectivities before and after the coating, respectively. If it is assumed that R=35% for the uncoated Si, based on our reflectivity measurements, and R$^1$=0, then the maximum improvement due to perfect antireflection coating should be only 53%. Therefore, the observed 57% improvement in the J$_{sc}$ in Table B suggests that the defect/surface passivation due to SiO$_x$/SiN might contribute toward greater than 53% improvement in J$_{sc}$. The passivation due to SiO$_x$/SiN coating was indeed confirmed by the measurement of saturation current density J$_o$ from the detailed dark I-V analysis. Table B shows a significant reduction in the J$_o$ due to the PECVD SiO$_x$/SiN which also accounts for the remarkably high increase in V$_{oc}$ in Table B. Assuming a near-ideal float zone silicon cell, the increase in V$_{oc}$ can be estimated as follows:

$$\Delta V_{oc} = \frac{KT}{q} A r[\ln(J_{sc}'/J_{sc}) + \ln(J_o/J_o')] \quad (2)$$

where J$_{sc}$ and J$_o$ represent the short-circuit and reverse saturation current densities before antireflection coating, and $J'_{sc}$ and $J'_o$ are the corresponding values after the coating. The calculated improvement in $V_{oc}$ of 15 millivolts (mV) for MgF$_2$/ZnS coating and 44 mV for SiO$_x$/SiN coating, using measured $J_{sc}$ and $J_o$, are in good agreement with the measured increase in $V_{oc}$ of 12 and 48 mV, respectively. It should be further noted that the Tables A and B show that the improvement in $V_{oc}$ and $J_o$ is much greater for the SiO$_x$/SiN-coated cells than the MgF$_2$/ZnS-coated cells.

Tables C and D, which are set forth hereafter, demonstrate the improvement in cell parameters of those cells which had thin SiO$_x$ surface passivation prior to the AR coating. Table C shows the parameters for the prior art MgF$_2$/ZnS coating, and Table D shows the parameters for the novel SiO$_x$/SiN coating. It is interesting to note that the absolute value of $J_{sc}$ was virtually the same after both the antireflection coatings, even though the SiO$_x$/SiN coating has slight reflection. Equally important is the fact that the PECVD SiO$_x$/SiN coating again gave larger improvements in $V_{oc}$ and $J_o$, even when the cells had oxide passivation. However, the relative improvement was much smaller than in the case when no oxide passivation coating was present.

TABLE C

| | MgF$_2$/ZnS Coating | | | | |
|---|---|---|---|---|---|
| ID | $J_{SC}$(mA) | $V_{OC}$(V) | FF | Eff (%) | $J_O$(A) |
| Before | 24.32 | 0.630 | 0.756 | 12.19 | 2.58 × 10$^{-13}$ |
| After | 35.71 | 0.642 | 0.807 | 18.55 | 2.48 × 10$^{-13}$ |
| Improvement | 46.8% | 1.9% | | 52% | |

TABLE D

| | SiO$_X$/SiN Coating | | | | |
|---|---|---|---|---|---|
| ID | $J_{SC}$(mA) | $V_{OC}$(V) | FF | Eff (%) | $J_O$(A) |
| Before | 24.14 | 0.633 | 0.7959 | 12.16 | 2.47 × 10$^{-13}$ |
| After | 35.69 | 0.657 | 0.804 | 18.87 | 1.46 × 10$^{-13}$ |
| Improvement | 47.8% | 3.7% | | 55% | |

Figure 3:
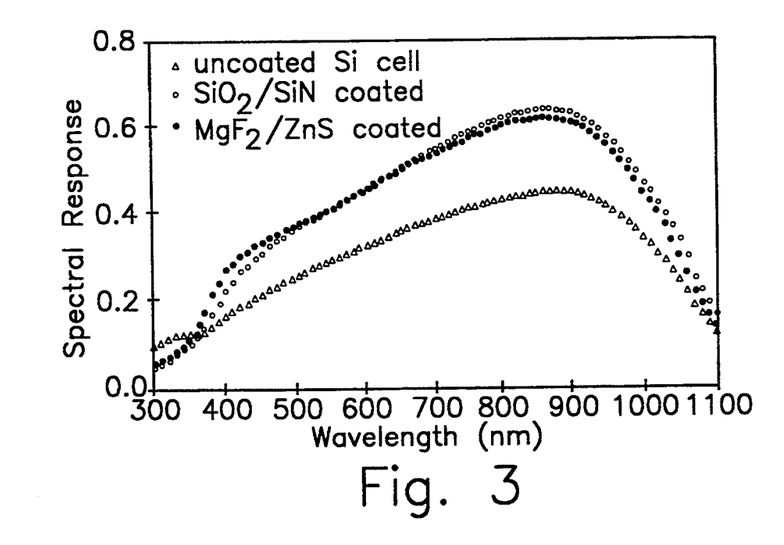
FIG. 3 is a graph of external spectral response (SP) for silicon cells having (a) no coating, (b) the novel $SiO_x$/SiN coating, and (c) the prior art $MgF_2$/ZnS coating.

The external spectral response (SP) of the cells, before and after deposition of SiO$_x$/SiN and MgF$_2$/ZnS coatings, is shown in FIG. 3. Coated cells showed much better external spectral response. It is noteworthy that the coated cells have slightly lower response in the wavelength range of 300 nm to 375 nm due to the absorption in both the coatings at higher energy. In order to separate antireflection and defect passivation effects, internal quantum efficiency (IQE) was calculated (IQE=SP/(1−R)), which is independent of the reflection properties.

Figure 4:
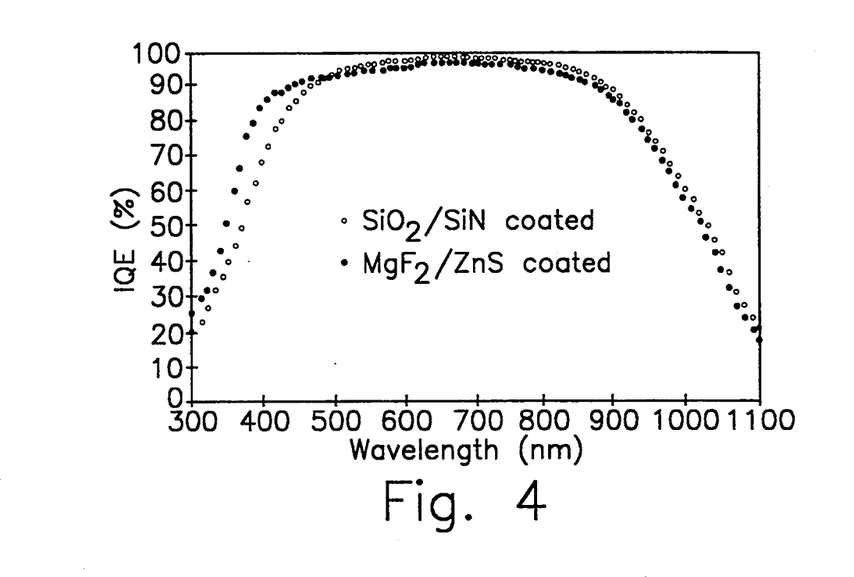
FIG. 4 is a graph of internal quantum efficiency (IQE) for silicon cells having (a) the novel $SiO_x$/SiN coating and (b) the prior art $MgF_2$/ZnS coating.

FIG. 4 shows the comparison of the IQE of SiO2/SiN and MgF$_2$/ZnS coated cells. Note that the IQE of MgF$_2$/ZnS coated cell is much higher in the wavelength range of 300 nm to 500 nm, but the IQE of SiO$_x$/SiN cell is slightly beyond the 500 nm, including higher maximum (IQE$_{max}$). The observed higher IQE of the MgF$_2$/ZnS-coated cell in the short-wavelength region could result from either lower front surface recombination in the MgF$_2$/ZnS-coated cell or higher absorption loss in the SiO$_x$/SiN-coated cell. If the former were true, it would be difficult to explain the higher IQE$_{max}$ in the SiO$_x$/SiN-coated cell, which is strongly related to the surface recombination. In this regard, see H. J. Hovel, *Metals and Semiconductors*, ch. 2, Academic Press, New York, 1975.

Therefore, absorption due to the higher refractive index of SiN is the more probable cause. To confirm this hypothesis, IQE of a cell was measured three times, first by covering the cell with a glass plate, and then by covering it with glass palates coated with the SiO$_x$/SiN and MgF$_2$/ZnS double-layer coatings, respectively. Since the same cell was used in these three measurements, surface and bulk recombination should be identical and should not contribute to the observed difference in IQE. The most likely cause of any perceived difference should be the absorption in the coatings.

Figure 5:
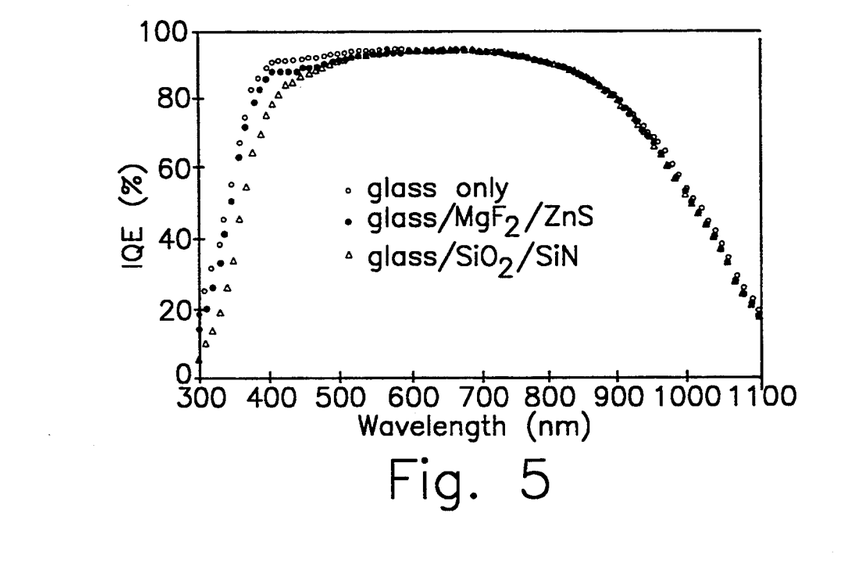
FIG. 5 is a graph of IQE for silicon cells having (a) a clear glass plate, (b) a clear glass plate with an overlying double-layer $SiO_x$/SiN coating, (c) a clear glass plate with an overlying double-layer $MgF_2$/ZnS coating.

FIG. 5 shows IQE data for the SiO$_x$/SiN and MgF$_2$/ZnS double-layer coatings. As illustrated in FIG. 5, both coated plates have higher absorption than the uncoated plate in short-wavelength range, below 400 nm. The IQE data in FIG. 5 clearly shows that much higher absorption occurs in the SiO$_x$/SiN coating as compared to MgF$_2$/ZnS coating below 500 nm. However, the absorption is very low for the wavelengths above 600 nm, which corresponds with an independent absorption measurement by multiple angle ellipsometry at a wavelength of 630 nm. These results confirm that the lower IQE of SiO$_x$/SiN-coated cell in the short-wavelength region is caused by the absorption. The surface passivation effect of SiO$_x$/SiN is unable to counterbalance the absorption loss in the short wavelength, and therefore, a crossover occurs in the IQE response. The higher maximum value of IQE for the SiO2/SiN-coated cell supports the notion of SiO$_x$/SiN-induced defect/surface passivation.

In conclusion, a novel double-layer SiO$_x$/SiN antireflection coating applied by PECVD has been developed which gives greater than 55% improvement in the efficiency of the oxide-passivated single-crystal Si cells, and about 66% increase in the performance of the unpassivated cells. The optimized PECVD SiO$_x$/SiN coating consists of 590-Å-thick SiN with an index n of about 2.3 under a 950-Å-thick SiO$_x$ with an index n of about 1.45. The properties of this novel coating are compared with one of the best and frequently used double-layer MgF$_2$/ZnS antireflection coating. The reflectivity of the SiO$_x$/SiN coating is slightly higher but comparable to that of the MgF$_2$/ZnS coating. The defect/surface passivation due to the PECVD SiO$_x$/SiN deposition was supported by the decrease in $J_o$, and increase in $V_{oc}$ and IQE. Even though the SiO$_x$/SiN coating has higher absorption and reflection losses compared to the MgF$_2$/ZnS coating, the passivation effect of the PECVD coatings results in higher $V_{oc}$ and overall cell efficiency. The passivation feature of the PECVD coating significantly reduces the gap between the oxide passivated and unpassivated cells. Therefore, it is possible to realize both passivation and antireflection coating by the PECVD technique proposed in this paper for a commercial cell process. Finally, cell efficiency improvement due to the SiO$_x$/SiN coating depends on the front surface recombination velocity $S_f$ before the antireflection coating deposition. The larger the $S_f$, the higher the relative improvement due to the PECVD coating.

It will be obvious to those skilled in the art that many modifications and variations may be made to the experiments and embodiments described above without substantially departing from the principles of the present invention. It is intended that all such modifications and variations be included herein within the scope of the present invention, as set forth in the following claims.

Wherefore, the following is claimed:

1. A method for forming an antireflection coating for a surface of silicon, comprising the steps of:
   forming a silicon nitride coating with a refractive index of about 2.3 on the silicon using plasma enhanced chemical vapor deposition and;
   forming a silicon oxide coating on said silicon nitride coating using plasma enhanced chemical vapor deposition.

2. The method of claim 1, further comprising the step of heating said silicon nitride coating in combination with said silicon oxide coating with a light radiating source.

3. The method of claim 1, wherein said silicon is n-type silicon.

4. The method of claim 1, wherein said silicon is p-type silicon.

5. The method of claim 1, wherein said silicon oxide coating has a refractive index of about 1.45.

6. The method of claim 1, wherein said silicon nitride coating and said silicon oxide coating are both formed below about 275 degrees Celsius.

7. The method of claim 1, wherein an electromagnetic plasma excitation signal having a frequency of about 13.6 megahertz is employed during formation of said silicon nitride coating and during formation of said silicon oxide coating.

8. The method of claim 1, wherein a plasma comprising silane (SiH$_4$) and ammonia (NH$_3$) is employed during formation of said silicon nitride coating.

9. The method of claim 1, wherein a plasma comprising silane (SiH$_4$) and nitrous oxide (N$_2$O) is employed during formation of said silicon oxide coating.

10. The method of claim 2, wherein said heating step is performed at about 350 degrees Celsius for about 20 minutes.

11. The method of claim 2, wherein said heating step includes the step of utilizing a forming gas having hydrogen so that said hydrogen migrates to and passivates defects within said silicon.

12. The method of claim 11, wherein said forming gas comprises about 90 percent by volume nitrogen gas and 10 percent by volume hydrogen gas.

13. A method for forming an antireflection coating for a surface of silicon, comprising the steps of:
    forming a silicon nitride coating on the silicon using plasma enhanced chemical vapor deposition;
    forming a silicon oxide coating on said silicon nitride coating using plasma enhanced chemical vapor deposition; and
    manipulating a refractive index associated with said silicon nitride coating during formation of said silicon nitride coating by adjusting an amount of silicon in said silicon nitride coating so that said refractive index is about 2.3.

14. A method for forming an antireflection coating for a surface of silicon, comprising the steps of:
    forming silicon nitride coating on the silicon using plasma enhanced chemical vapor deposition;
    forming silicon oxide coating on said silicon nitride coating using plasma enhanced chemical vapor deposition;
    manipulating a refractive index associated with said silicon nitride coating during formation of said silicon nitride coating by adjusting an amount of silicon in said silicon nitride coating so that said refractive index is about 2.3; and
    heating said silicon nitride coating in combination with said silicon oxide coating with a light radiating source.

15. The method of claim 13, further comprising the step of heating said silicon nitride film in combination with silicon oxide coating with a light radiating source.

16. The method of claim 13, wherein said silicon is n-type silicon.

17. The method of claim 13, wherein said silicon is p-type silicon.

18. The method of claim 13, wherein said silicon oxide coating has a refractive index of about 1.45.

19. The method of claim 13, wherein said silicon nitride coating and said silicon oxide coating are both formed at a temperature of about 250 to 300 degrees Celsius.

20. The method of claim 13, wherein an electromagnetic plasma excitation signal having a frequency of about 13.6 megahertz is employed during formation of said silicon nitride coating.

21. The method of claim 13, wherein a plasma containing silane (SiH$_4$) and ammonia (NH$_3$) is employed during formation of said silicon nitride coating and wherein said refractive index is manipulated and said amount of silicon is adjusted by controlling the ratio of said silane and said ammonia.

22. The method of claim 13, wherein a plasma containing silane (SiH$_4$) and nitrous oxide (N$_2$O) is employed during formation of said silicon oxide coating.

23. The method of claim 15, wherein said heating step is performed at about 350° C.

24. The method of claim 14, wherein said silicon oxide coating is formed with a refractive index of about 1.45.

25. The method of claim 14, wherein said heating step is performed at about 350° C., 26. The method of claim 14, wherein said heating step includes the step of utilizing a forming gas having hydrogen so that said hydrogen migrates to and passivates defects within said silicon.

27. The method of claim 26, wherein said forming gas comprises about 90% by volume nitrogen gas and about 10% by volume hydrogen gas.

* * * * *

UNITED STATES PATENT AND TRADEMARK OFFICE
CERTIFICATE OF CORRECTION

PATENT NO. : 5,418,019
DATED : May 23, 1995
INVENTOR(S) : Chen et al.

It is certified that error appears in the above-indentified patent and that said Letters Patent is hereby corrected as shown below:

In column 1, line 16, change "SIN" to --SiN--.

In column 3, line 14, change "SIN" to --SiN--.

In column 3, line 18, change "amonia" to --ammonia--.

In column 3, line 21, after "adjusting" insert --the--.

In column 6, line 65, in equation (2), change "$J_{sc}'$" to --$J'_{sc}$-- and change "$J_o'$" to --$J'_o$--.

In column 7, line 52, change "SiO2" to --$SiO_2$--.

In column 8, line 3, change "palates" to --plates--.

Signed and Sealed this

Twenty-ninth Day of August, 1995

BRUCE LEHMAN

*Attest:*

*Attesting Officer*  *Commissioner of Patents and Trademarks*

UNITED STATES PATENT AND TRADEMARK OFFICE
CERTIFICATE OF CORRECTION

PATENT NO.   : 5,418,019
DATED        : May 23, 1995
INVENTOR(S)  : Chen et al.

It is certified that error appears in the above-indentified patent and that said Letters Patent is hereby corrected as shown below:

In column 1, line 6, insert --The U.S. Government has a paid-up license in this invention and the right in limited circumstances to require the patent owner to license others on reasonable terms as provided for by the terms of Contract No. AA-1638, under Project No. E-21-H31, awarded by the Department of Energy--.

Signed and Sealed this

Twenty-seventh Day of February, 1996

Attest:

BRUCE LEHMAN

*Attesting Officer*               *Commissioner of Patents and Trademarks*